United States Patent [19]
Bennin et al.

[11] Patent Number: 5,687,479
[45] Date of Patent: Nov. 18, 1997

[54] ELECTRICAL TRACE INTERCONNECT ASSEMBLY

[75] Inventors: Jeffry S. Bennin, Hutchinson; Todd Boucher, Stewart, both of Minn.; Jeffrey W. Green, Sioux Falls, S. Dak.; Gary E. Gustafson, Darwin, Minn.; Ryan Jurgenson, Hutchinson, Minn.; Brent D. Lien, Minneapolis, Minn.

[73] Assignee: Hutchinson Technology Incorporated, Hutchinson, Minn.

[21] Appl. No.: 634,972

[22] Filed: Apr. 19, 1996

Related U.S. Application Data

[62] Division of Ser. No. 227,978, Apr. 15, 1994, abandoned.

[51] Int. Cl.$^6$ ........................................... H01R 43/16
[52] U.S. Cl. ........................... 29/885; 360/103; 360/126
[58] Field of Search ..................... 29/885; 360/103, 360/104, 126

[56] References Cited

U.S. PATENT DOCUMENTS

| | | | |
|---|---|---|---|
| 5,027,247 | 6/1991 | Nakanishi | 360/126 |
| 5,282,103 | 1/1994 | Hatch et al. | 360/103 X |
| 5,311,384 | 5/1994 | Johnson | 360/103 X |
| 5,353,181 | 10/1994 | Frater et al. | 360/103 X |

FOREIGN PATENT DOCUMENTS

| | | | |
|---|---|---|---|
| 364263 | 4/1990 | European Pat. Off. | 360/103 |
| 605984 | 7/1994 | European Pat. Off. | 360/103 |

*Primary Examiner*—Carl J. Arbes
*Attorney, Agent, or Firm*—Faegre & Benson LLP

[57] ABSTRACT

A trace interconnect assembly for transmitting electrical signals to and from a head assembly in a hard disk drive. The interconnect assembly includes one or more single-layer thin, elongated, and generally flat substrate-free trace interconnects. The trace interconnects are new conductors etched out of a planar length of preferably a high tensile and high yield strength metal such as beryllium copper. They are shaped to match the surface topology of the suspension assembly. Trace interconnects have a rigid region and flexible regions that match a rigid region and flexible regions in the suspension assembly. Different additional elements include support braces, standoffs, trace tangs, bond pads, and stacked interconnects. Coupling a head assembly to the interconnect assembly creates a head interconnect harness. Methods of manufacture for the trace interconnect assembly, a multi-conductor stacked version, a head suspension assembly, and the head interconnect harness are disclosed.

23 Claims, 8 Drawing Sheets

ELECTRICAL TRACE INTERCONNECT ASSEMBLY

This application is a division of U.S. patent application Ser. No. 08/227,978 filed Apr. 15, 1994, now abandoned entitled "ELECTRICAL TRACE INTERCONNECT ASSEMBLY", which is related to U.S. patent application Ser. No. 08/227,960, filed Apr. 15, 1994, entitled "GIMBAL FLEXURE AD ELECTRICAL INTERCONNECT ASSEMBLY", now issued as U.S. Pat. No. 5,491,597 on Feb. 13, 1996.

CROSS-REFERENCE TO RELATED APPLICATIONS

The present application is related to a copending application entitled GIMBAL FLEXURE AND ELECTRICAL INTERCONNECT ASSEMBLY filed concurrently with the present application.

FIELD OF THE INVENTION

The present invention relates to an improved electrical interconnect conductor and interconnect assembly for conducting electrical signals to and from a floating head assembly in a head suspension assembly in a dynamic storage device or rigid disk drive. The new interconnect uses traces—substrateless, flat electrical conductors. The present invention simplifies manufacturing of the head suspension assembly and allows flexibility of the head suspension's spring regions.

BACKGROUND OF THE INVENTION

Head suspension assemblies (HSAs) in rotatable data storage devices are spring structures that perform the difficult task of holding and positioning a head assembly nanometers away from the rapidly spinning irregular surface of a rotatable data storage device. The HSA can be part of a magnetic hard disk drive, the most common type of disk drive today, or of another type of drive such as an optical disk drive.

A HSA comprises different elements, the most common being a suspension assembly and a head assembly. A suspension assembly, the spring element, usually includes a load beam and a gimbal, each composed of a carefully balanced combination of rigid regions and flexible spring regions. A typical head assembly includes a "head", comprising a highly sensitive read/write transducer, that is attached to an air bearing slider.

In a magnetic disk drive, a write transducer transforms electrical pulses to small magnetic fields which it then "writes" on a magnetic disk. A read transducer decodes these magnetic fields back into electrical pulses. The order of the magnetic fields and their subsequent orientation, aligned along the circumference of the disk in north-south configuration, defines a bit code that the transducer detects as the head floats on a cushion of air over the magnetic disk.

A head suspension assembly generally attaches at its proximal end to a rigid arm manipulated by a linear or rotary motion actuator designed to locate the head at any radial position above the disc. The spinning disk coupled with the actuator movement allows the head to gain access to multiple tracks across the disk surface, each track capable of containing large amounts of densely stored data. Positioned at the distal end of a suspension assembly, a gimbal holds the head assembly level and at a constant distance over the contours of the disk.

The closer the head assembly can fly to the surface of a magnetic disk, the more densely can information be stored (the strength of a magnetic field is inversely proportional to the square of the distance, thus the closer the head flies the smaller the magnetic "spot" of information). Today's disk drives strive to reach flying clearances close to 100 nanometers=0.1 micrometers (a human hair is about 100 micrometers thick). Greater data densities allow for greater storage and smaller size. But the head assembly must not touch the disk ("crash"), as the impact with the rapidly spinning disk (rotating at about 3600 rpm or faster) could destroy both the head and the surface of the disk, along with the data stored on it.

In order to achieve this delicate and precise positioning, a suspension assembly must carefully balance the load applied to the head assembly against the upward lift of the air stream on the slider. Since at this microscopic level the seemingly smooth surface of the disk is full of peaks and valleys, the HSA must be very responsive in order to maintain a level flying height. To avoid delays and errors, the HSA must be low in mass and both rigid to resist inertial movement and vibration and flexible to adapt to the undulations on the surface of the disk. Given the minute tolerances involved, even a small unexpected change in the loads or biases within the HSA, and specially in the flexibility of the spring regions, may cause a destructive crash.

As the head writes and reads to and from the disk, it receives and sends electrical pulses of encoded information. These electrical signals are amplified and processed by appropriate circuitry. Signal transmission requires conductors between the dynamic "flying" slider and the static circuitry of the data channels. However, while conductors can be routed fairly easily over the rigid actuator arm, providing the final interconnections through the suspension assembly and to the head is often extremely troublesome with current interconnect schemes.

Specially designed HSA interconnect assemblies are required in order to relay electrical signals accurately while not disturbing the precise balance of the HSA components. The term interconnect assembly refers to the entire interconnect system, including conductors, insulators, and other features. In order to assure data precision, interconnect assemblies must transmit the electrical signals free from interference or signal loss due to high inductance, high capacitance, and/or high resistance. Optimal interconnect conductors must be attached securely in order to reduce movement and vibration which cause varying electrical characteristics and affect mechanical performance. They must have low resistance and be well insulated from electrical ground.

Also, as technology advances, an interconnect system also must be capable of handling a plurality of signals. A basic interconnect assembly for a transducer having a single read/write inductive element calls for two conductors. More complex transducer designs may incorporate a separate magneto-resistive read element and an inductive write element, thus requiring a minimum of 3 conductors if the elements are tied together or a minimum of 4 conductors if the elements are completely separate. Other systems require even more conductors.

The problem is that in a HSA, interconnect assemblies must be planned around competing and limiting design considerations. The interaction of all the elements of an HSA forms a carefully balanced system. An ideal interconnect assembly must satisfy strict mechanical and manufacturing requirements.

First, an interconnect assembly must not impose unpredictable loads and biases which might alter the exact positioning of the head assembly, nor must it detract from the ability of the spring regions to adjust to variations in the surface of the disk, vibrations, and movement. Alterations to the flying height of the head can significantly affect data density and accuracy and even destroy the system in a crash. Neither of these two results would be well received by computer users.

Rigidity increases in relation to the third power of cross-sectional thickness. To respond to air stream changes and to hold a floating head, suspension assemblies are very thin and light, specially around the sensitive spring areas. A thick conductor placed atop of a thin suspension will dramatically increase a spring region's stiffness. Moreover, overshoot errors caused by inertial momentum are also affected by thick, high-in-mass conductors. Therefore, the ideal interconnect assembly must be low in mass and be very thin. As an additional requirement, interconnects placed over spring regions must not plastically deform when the region flexes, since that would hinder the return of the spring to its normal position and apply a load on the suspension assembly.

A second design consideration comes from manufacturing constraints. Like any commercial product, interconnect assemblies must be efficient to manufacture. Additionally, they must mate well and easily with the suspension assembly and the head assembly, be resistant to damage, and have precise manufacturing tolerances. Complex shaping and mounting processes are costly and decrease the reliability of the whole HSA manufacturing process. Fragile electrical conductors or interconnects that have to be added to the suspension assembly early in the manufacturing process are more susceptible to damage by subsequent production steps. They drastically diminish the manufacturing useful output yield.

Exacting tolerances are necessary to avoid defects and unpredictable loads and biases, specially when dealing with such minute measurements and clearances. During the process of manufacturing and assembling the HSA and of attaching an interconnect system, any lack of precision in forming or assembling the individual elements contributes to a lack of planarity in the surfaces of the elements. A buildup of such deviations from tolerance limits in the individual elements can cause deviation from desired planar parallelism in the final head suspension assembly. The parameters of static roll and static pitch torque in the final HSA result from these inherent manufacturing and assembly tolerance buildups. As the industry transitions to smaller slider/transducer sizes to increase data storage density, limitations of the current interconnecting devices increase the potential for read/write errors and impose ceilings on data storage density.

In conclusion, as today's data density requirements necessitate for the head to fly even closer to the disk, there is less room for imprecise manufacturing and unaccounted loads or stiffness. An interconnect system must accurately transmit a plurality of signals, yet be efficient and precise to manufacture and to mount, have minimum mass, stiffness, plastic deformation, and thickness.

DESCRIPTION OF RELATED ART

Traditional HSA interconnect systems use either copper wires or flexible circuits. Wire interconnects utilize manually routed small insulated copper wires (44 AWG and greater) threaded into non-conductive PTFE tubing (0.25 mm–0.38 mm). Enclosing the insulated copper wires within the tubing provides protection from potentially damaging vibrational contact with the suspension member. The PTFE tube typically extends from the distal end of the suspension assembly along the center or the side rails, top or bottom surface of the suspension, to the proximal end of the suspension assembly and beyond. To avoid greatly reducing the dynamic performance and flight characteristics of the slider, only the fine wires are manually curved past the suspension out to the head's electrical terminals to form a service loop.

Wires encased in tubular insulation sheaths (hereinafter wires) possess the advantage that they can be manufactured separately from the suspension assembly and can be added in the final steps of manufacture. They also can adapt to a wide variety of head suspension assembly configurations and topographies and are fairly resistant to breakage and short circuits.

Wires cause problems due to their varying inductances, high profile, and demand for labor and machine intensive processes. Manual conductor routing along the suspension assembly and service loop, can induce unfavorable and unpredictable static slider bias or bias variability. If the wires are not securely fastened along their length to the surface of the suspension assembly they may flex and move. This movement causes variable electrical characteristics. If the service loop is too loose, the wires may snag and reduce the Z-axis clearance. If it is too tight, the wires introduce mechanical stresses and loads in the system. Lack of orientation, placement, and spacing definition of free form twisted conductors at bond sites increases bias variability and bond positioning labor. Usage of suspension appendages termed "wire-crimps", to anchor PTFE tubular wire sheaths, have the potential of inducing stresses to the suspension that affect static roll and pitch. They also may damage the twisted conductors. Profile limitations imposed by PTFE tubing and wire crimp tabs can limit disk stack height.

Individual positioning and bonding of conductors to the slider and amplifier/signal processing electronic cable requires significant labor. As the assembly of head suspension assemblies becomes more automated, the manual routing/bonding of the tube and wire interconnect poses an obvious constraint.

Wires attached along the length of the suspension assembly also may affect the suspension assembly's stiffness and flexibility. The oxygen free copper usually used for the twisted wires has a very low yield strength and has a tendency to plastically deform during assembly and handling, subjecting the suspension assembly to unaccounted stresses. In addition, the constant diameter of the wire does not allow for changes in resistance along certain regions of the suspension assembly. This imposes design limitations due to the trade-off between the fixed inherent electrical resistance (per unit length) of the wire and the need for reduced wire spring stiffness (a function to the fourth power of the wire diameter) along the flexible regions.

Recent developments involve removing the PTFE tubing and using a twisted wire pair bonded in spots to the suspension assembly with an adhesive. This eliminates the added cost and height associated with the PTFE tubing. However, in order to ensure flatness, straightness, and to improve the repeatability and placement accuracy of tubeless wire interconnects, complex automated machinery, such as tensioning devices, are required.

Another common interconnect system uses electrical flex circuits. Electrical flex circuits are flat or round conductive wires laminated within plastic film layers. One of the most common flex circuit embodiments consists of a flat layer of soft copper approximately 18 micrometers to 35 micrometers thick placed on top of an insulating substrate, usually a polyimide material ~25 micrometers thick. Flex circuit interconnects are often adhesively bonded to the suspension assembly.

Flex circuits may follow the surface topology of the suspension assembly and may be attached to the suspension assembly all along their length or in selected regions. The resistance along the path of the flex circuit can also be increased or reduced by increasing or reducing the width of the conductors as they transit through certain areas. Flex circuits can be placed on the suspension assembly by automation, have low profiles, controlled impedances, spaced leads, and favorable dynamic response.

But flex circuits also create several problems. The copper traditionally used in flex circuits is prone to plastic deformation, and may introduce unexpected loads on the head suspension assembly. The film substrates used within flexible circuitry lend a high stiffness value to the interconnect.

The substrate in a flex circuit functions both as an electrical isolator and as a base assembly aid/support. While a thin layer would suffice for electrical isolation, to function as base support the dielectric film has to be substantial enough to have some rigidity to allow handling and processing. The thick substrate necessary to support the copper conductors affects the rigidity and flexibility characteristics of the load beam and the gimbal. Traditional load beams are ~65 micrometers thick. The addition of a flex circuit at least 43 micrometers thick placed away from the neutral axis of bend of the load beam, more than quadruples the rigidity along the spring regions. This effect is even more drastic along the gimbal. Since conductors usually run on only one side of the load beam, this increase in stiffness is also not symmetrical. Other traditional materials thin enough to reduce interconnect stiffness are difficult to work with and costly.

Finally, although profile, electrical performance, and automation compatible advantages of flex circuitry prove better than those of wires, high volume manufacture of flex circuits lacks precision and is costly. Flex circuits are very difficult to manufacture to specifications similar to suspensions. Polyimide as used as a flex circuit substrate can be mass produced to feature tolerances of ±50 micrometers. Exact shaping and matching to the surface topology of an irregular suspension assembly is difficult to achieve. Fine feature patterning techniques of the dielectric substrates (e.g., laser patterning, caustic etching, dry etching) are costly and difficult to implement for large scale production.

A third type of suspension assembly interconnect utilizes plastic compounds either complementing the function of (such as a thin film overlay) or acting as an integral element of the suspension assembly structure. The conductive elements of the interconnect can either be heat staked or molded into the plastic structure. This provides a low profile, favorable dynamic response, and protective attachment to the suspension assembly.

A major problem with the use of plastic materials is that plastics lack the optimal characteristics for use in load beam and gimbal construction. As the flying height and head size continually decrease in the progression towards greater disk storage density, the accuracy and control needed to align the transducer to the correct data track upon the disk surface follows suit. The use of thermally expansive plastics as structural elements of the load beam or gimbal region poses dimensional stability limitations. Heavily interweaved designs of the interconnect and suspension assembly lead to restrictive design constraints on the suspension assembly and/or rigid disk drive designers. Also, since the electrical conductors in flex circuits must be formed on the suspension assembly early in the manufacturing process, the conductors are susceptible to damage from welding, etching, and other manufacturing steps. As a result, the final yield of usable head suspension assemblies is diminished.

SUMMARY

The present invention discloses a reliable electrical trace interconnect conductor, as well as interconnect assemblies including such an interconnect. The specification also discloses improved HSAs and novel, more efficient, manufacturing methods of manufacture that use this new trace interconnect. The trace interconnect and interconnect assemblies are thin, low-profile, low in mass, improve manufacturing efficiency and precision, offer good electrical characteristics, and do not unexpectedly affect the rigidity and flexibility of the suspension assembly. A trace interconnect can match different suspension topographies, can vary its resistance and dimensions along its path, and is constructed separately and independently of the suspension assembly. The present invention combines the advantages of independent wires with those of flex circuits, while avoiding the main disadvantages of either.

An interconnect in an HSA transmits electrical signals across the HSA. The usual path connects the head assembly to connectors leading to amplifying and processing circuitry. The present trace interconnect assembly is a HSA interconnect that includes a novel pre-shaped single-layer thin, elongated, and generally flat substrate-free conductor called a trace. Traces are made out of a single-layer thin planar segment of conductive material.

A trace interconnect is constructed separately from a suspension assembly. This separate construction reduces manufacturing damage and simplifies HSA construction. Each trace interconnect is pre-shaped and arranged along the X, Y, and Z coordinates to match the surface topology of at least a portion of the suspension assembly. The trace interconnect may include rigid regions and/or flexible regions that correspond to rigid regions and flexible regions in a suspension assembly, a distal end, a proximal end, a first major surface, and a second major surface.

The trace interconnect extends from a terminal on the head assembly to a connection terminal at their proximal end. The distal ends of the trace interconnects are designed to connect to the electrical terminals on the head. The proximal ends are designed to connect to conductors leading to the processing and amplifying circuitry. Connection terminals may be placed at both ends to facilitate connections. The preferred materials for the trace interconnect have a high-yield and high-tensile strength, sufficient to act as spring materials. Spring materials are those that do not plastically deform (yield) given the loads during HSA manufacture and use. For this purpose, the invention discloses the novel use of beryllium copper alloy traces. The preferred method of manufacture involves photochemically etching the trace interconnects.

A thin dielectric coating, only as thick as necessary to guarantee electrical isolation, coats the trace interconnect. A separate adhesive may attach the trace interconnect to the suspension assembly. The dielectric also may double up as the adhesive. The absence of a substrate backing makes this trace interconnect lighter and thinner, thus reducing its load and stiffness effect on the suspension.

The trace interconnect may vary in width and thickness along its length and may include cantilevered trace tangs. Tangs are prongs that protrude from a distal end of the trace interconnect and help to connect the trace interconnects to edge mounted transducer electrical bond pads on the head.

An interconnect assembly includes one or more trace interconnects, usually extending side-by side and in parallel with each other. A preferred embodiment includes two photochemically etched trace interconnects. Among the prominent features are integral standoffs protruding from the first major surface and separating the trace interconnects from the load beam, thus decreasing the capacitance. Slider bond pads at the end of the trace interconnects mechanically attach the interconnect assembly directly to the head assembly. Ends of the trace interconnect and electrical connection terminals can be overcoated with a suitable metal.

The interconnect assembly also may include a support brace bracketing the trace interconnects and providing a carrier element for alignment and fabrication. The brace includes a planar border that may be L-shaped, C-shaped, or O-shaped. The brace also includes tooling registration holes and support tabs that attach to the trace interconnects.

For multiple signal interconnect assemblies, sets of trace interconnects can be stacked and laminated atop each other. To reduce stiffness in these interconnects, the flexible regions and ends of the trace interconnects may fan out in spaced relationships in a single plane.

BRIEF DESCRIPTION OF THE DRAWINGS

The features, aspects, and advantages of the present invention will become better understood with regard to the following description, appended claims, and accompanying drawings, where:

DETAILED DESCRIPTION

The trace interconnect of the present invention offers very good electrical performance and excellent mechanical characteristics. The trace interconnect uses a novel conductive trace—that is, a pre-shaped, resilient, single-layer, thin, elongated, and generally flat substrate-free conductor—to conduct electrical signals to and from a head assembly. The electrical trace interconnect and interconnect assembly attach easily to a suspension assembly, do not require a substrate, are low in mass, efficient to manufacture, and have minimal detrimental effect on the flexibility of the suspension assembly.

Figure 1:
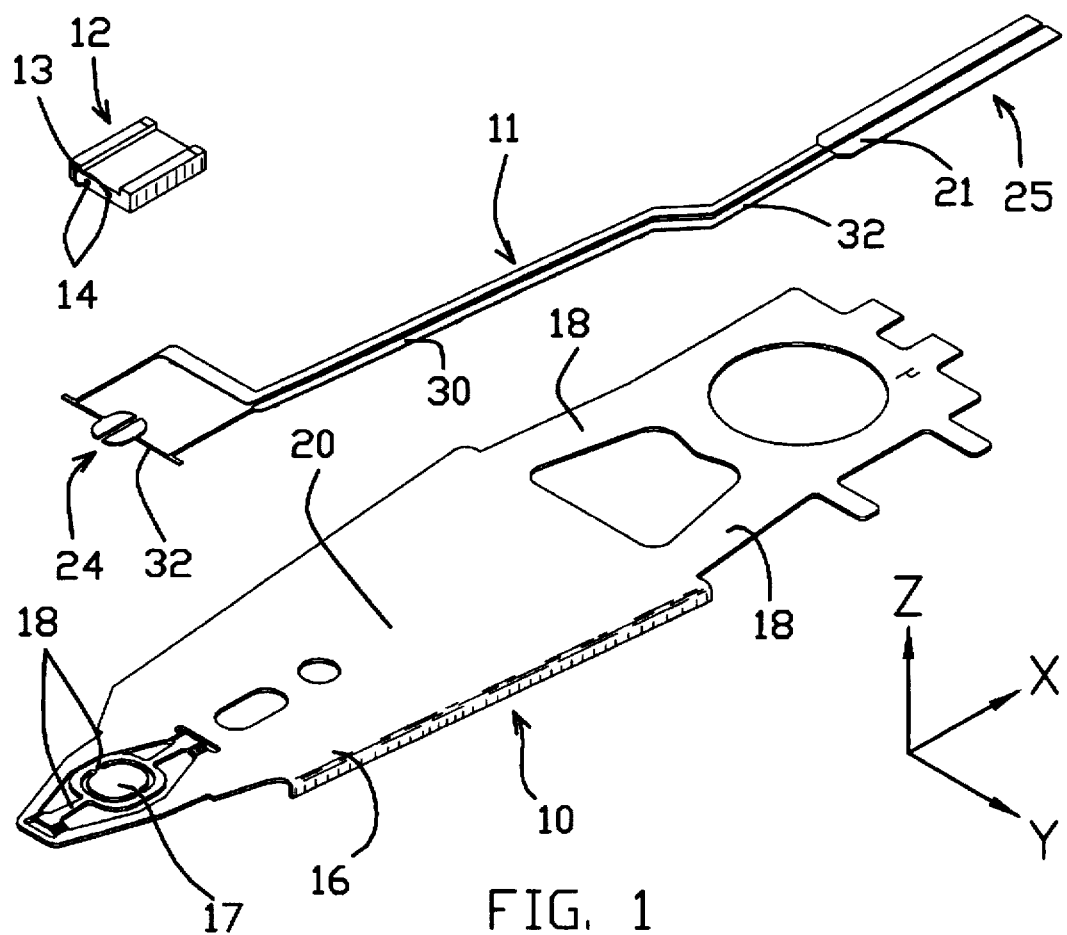
FIG. 1 shows an exploded perspective view of a head suspension assembly including an electrical interconnect assembly embodying features of the present invention.
Figure 2:
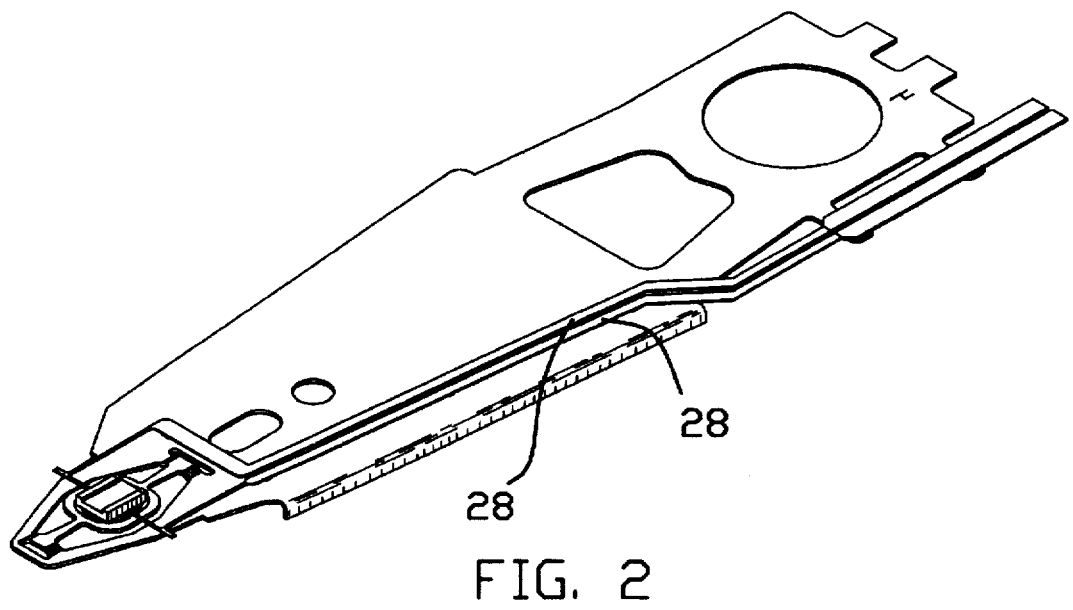
FIG. 2 shows a perspective view of the assembled head suspension assembly of FIG. 1.

The term "interconnect assembly" refers to the whole interconnect system in a head suspension assembly (HSA), including conductors, connectors, insulating, and structural features. A HSA, shown in FIGS. 1 and 2, is the combination of elements that positions a head assembly 12 over selected tracks of a rotating data storage device. The HSA includes a suspension assembly 10, an interconnect assembly 11, and a head assembly 12. FIGS. 1 and 2 illustrate how an interconnect assembly 11 according to the present invention becomes an element of a HSA.

The suspension assembly 10 is the spring and load element in a HSA. Its main job is to position accurately a floating slider head assembly 12 over selected tracks of a rotating data storage device or disk (not shown). The suspension assembly 10 includes a load beam 16 and a gimbal 17 and has flexible regions 18 and a rigid region 20. The head assembly 12 includes an air-bearing slider attached to a transducer (a "head") 13 and electrical terminals 14.

The interconnect assembly 11 is the element of a HSA that transmits electrical signals or pulses to and from the floating head assembly 12. These electrical signals encode the information written to or read from the data storage device. The present interconnect assembly 11 is constructed separately from the suspension assembly 10. Since it does not need a backing surface, it can attach to the suspension assembly 10 fairly late in a HSA's manufacturing process.

The key element of the present interconnect system is a trace interconnect 28. A trace interconnect 28 comprises a trace, a new single-layer, thin, generally flat, and substrate-free HSA conductor. The trace interconnect 28 can be pre-shaped as an elongated member that transits the surface of the suspension assembly 10 and extends from the electrical terminals 14 on the head assembly 12 to connectors leading to amplifying and processing circuitry. Although it can be relatively flexible, it is resilient and can be self-supporting in the present format and dimensions. It can be pre-shaped during initial manufacture to a desired shape or pattern. It can also be adjusted later to adjust to offsets and loads. It is preferrably manufactured with spring materials having a high-yield and high-tensile strength. Spring materials are those that do not plastically deform (yield) given the loads during HSA manufacture and use.

In a preferred embodiment, the trace interconnect 28 is pre-shaped along the X, Y, and Z coordinates to match and conform to the surface topology of at least a portion of the intended suspension assembly 10 in which it will be used. It has a rigid region 30 and flexible regions 32 that correspond to the rigid region 20 and flexible regions 18 of the load beam 16 and gimbal 17. It also includes a distal end 24, a proximal end 25, a first major surface 26, better shown in FIG. 3, and a second opposite major surface (not marked). The distal end 24 is constructed and arranged for electrically coupling to an electrical terminal in the head assembly, while the proximal end 25 is shaped for connection to processing circuitry. The first major surface 26 is usually the one facing the suspension assembly 10.

An interconnect assembly 11 uses at least one of these trace interconnects 28 to transmit electrical signals from the head to the amplifying and processing circuitry (not shown). Preferred formats, such as those of FIGS. 1 and 2, include two trace interconnects 28 extending coplanarly side-by-side in generally parallel paths between the electrical terminals 14 and a connection terminal 21 for coupling to the conductors leading to the circuitry (not shown). Two trace interconnects complete a circuit. One read/write circuit can function for both the read and the write modes. The connection terminal 21 for connecting the circuitry conductors can be placed at the proximal end of each of the trace interconnects 28. The layout and exit positions of the trace interconnects may vary depending on the location of the circuitry and the configuration of the suspension assembly 10. A hybrid embodiment may even include other types of conductors.

Figure 4A:
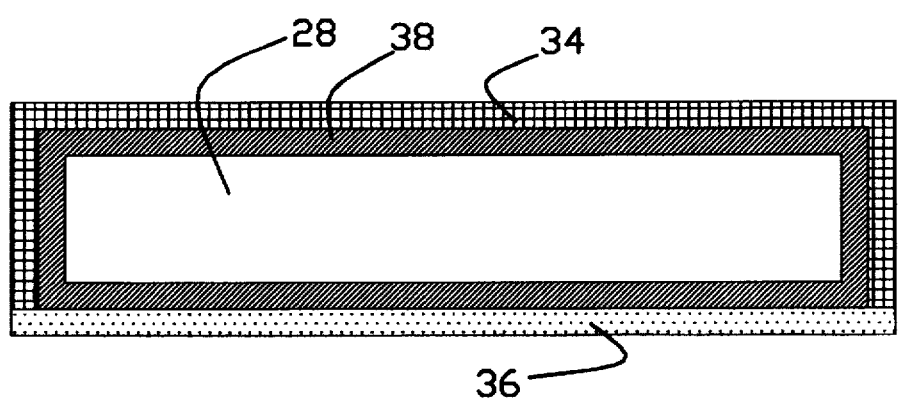
FIG. 4A shows an enlarged view of a cross-sectional cut of another embodiment of a conductive trace and added coatings.
Figure 4B:
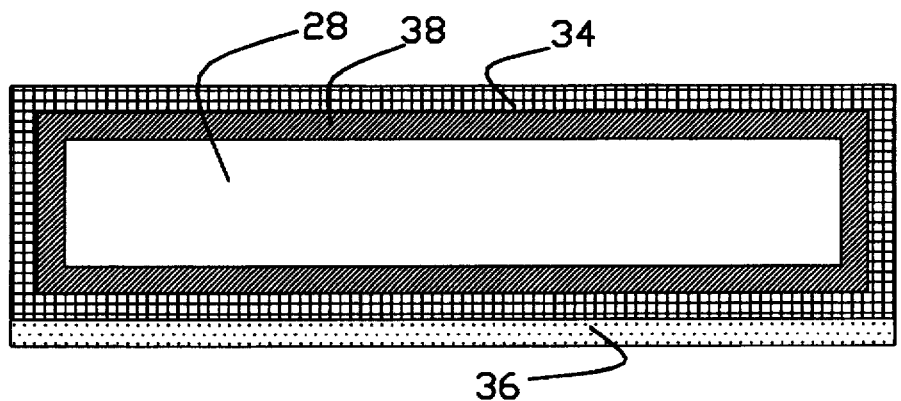
FIG. 4B shows an enlarged view of a cross-sectional cut of another embodiment of a conductive trace and added coatings.

A cross-sectional cut, such as those in FIGS. 4A and 4B, of a preferred trace interconnect 28 reveals a rectangular cross-section, although a trace interconnect can have other low-profile cross-sectional shapes. The trace interconnects 28 can mate with the suspension assembly 10 without manual routing, manipulation or tensioning devices. The entire interconnect assembly 11 can be detailed to mate with and to transit perfectly through a specific suspension assembly or be general enough to fit other standard suspension assemblies. FIGS. 1, 2, 5, and 6 show different formats of the interconnect assembly 11 adapting to a variety of different suspension assemblies. In order to achieve an optimal fit, the surface topology of the suspension assembly 10 is analyzed and the manufacturing model (e.g., etching mask or stamping press) is adjusted accordingly. FIG. 2 shows the interconnect assembly 11 of FIG. 1 mating with suspension assembly 10.

As shown in the interconnect assembly 11 of FIGS. 1 and 2, the trace interconnect 28 may vary in thickness and width along its different regions in order to reduce or increase its stiffening effect on the suspension assembly 10 and to optimize its electrical properties by varying cross-sectional resistance. Metal overcoating on the ends of the traceinterconnects and/or on the connection terminals 21 can improve the metallurgical and electrical characteristics of the bond sites.

Once the trace interconnect 28 has been shaped, selected areas are coated with a thin coating of a dielectric material 34, shown in FIGS. 4A and 4B, suitable for electrical isolation from the suspension assembly 10. The dielectric isolation coating 34 may be spray, dip, roll, or print coated to the trace interconnect 28. It may be applied to the entire trace interconnect 28, or only to specific areas, such as the first surface 26, slider bond pads 46 (described later herein), or standoffs 48.

Figure 3:
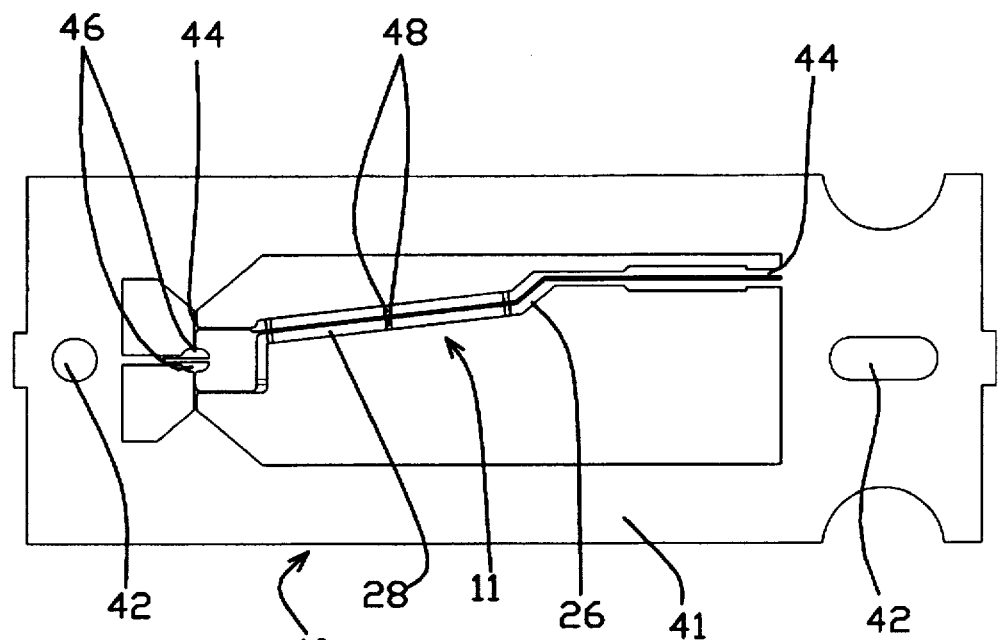
FIG. 3 shows a bottom view of a version of the present invention wherein the interconnect assembly is fabricated with a support brace.

Standoffs 48, shown in FIG. 3, are raised areas, generally shaped as pegs, that separate the trace interconnect 28 from the load beam 16. They are usually square, but may be fashioned in any shape. They are used to further improve the electrical characteristics of the interconnect assembly 11. The integral standoffs 48 protrude from the first surface 26 of the trace interconnect 28. This allows a cushion of air between the trace interconnect 28 and the load beam 16 to act as an additional dielectric layer and thus decrease the conductor to suspension ground distributed capacitance. Not only does the air cushion have excellent dielectric characteristics, but it does not add any additional mass to the interconnect assembly 11.

A preferred method to manufacture the trace interconnect 28 is to photochemically etch the traces out of a planar sheet of resilient conductive substrate-free material, preferably beryllium copper. Etching provides the fine feature patterning needed to guarantee reliability and an optimal fit. The trace interconnect 28 also may be stamped or electrically discharged machined (EDM'd).

As illustrated by FIG. 3, an interconnect assembly 11 may further include a support brace 40 that further improves the ease of handling and resistance to deformation of the trace interconnects 28. The brace 40 provides a carrier and support element for alignment and fabrication of the individual trace interconnects 28 and for the whole interconnect assembly 11. The brace 40 serves as a protective chassis, not only for the trace interconnects 28, but also for attached suspension assemblies 10. It may also be dielectrically coated.

The brace 40 includes a planar border 41 that may be O-shaped, C-shaped, L-shaped or even I-shaped and that extends along at least one side edge of the interconnect assembly 11. The brace also has tooling registration holes 42 and detachable support tabs 44 attaching and securing the trace interconnects 28 to the planar border 41. The brace 40 is designed so it can straddle the suspension assembly 10 and so that the border 41 does not interfere with mounting the trace interconnects 28 to the suspension assembly 10. Once the interconnect assembly 11 attaches to the suspension assembly 10, the brace 40 can serve as a carrier element for the whole HSA. When no longer required, the brace 40 can be removed by disengaging the support tabs 44.

Figure 11:
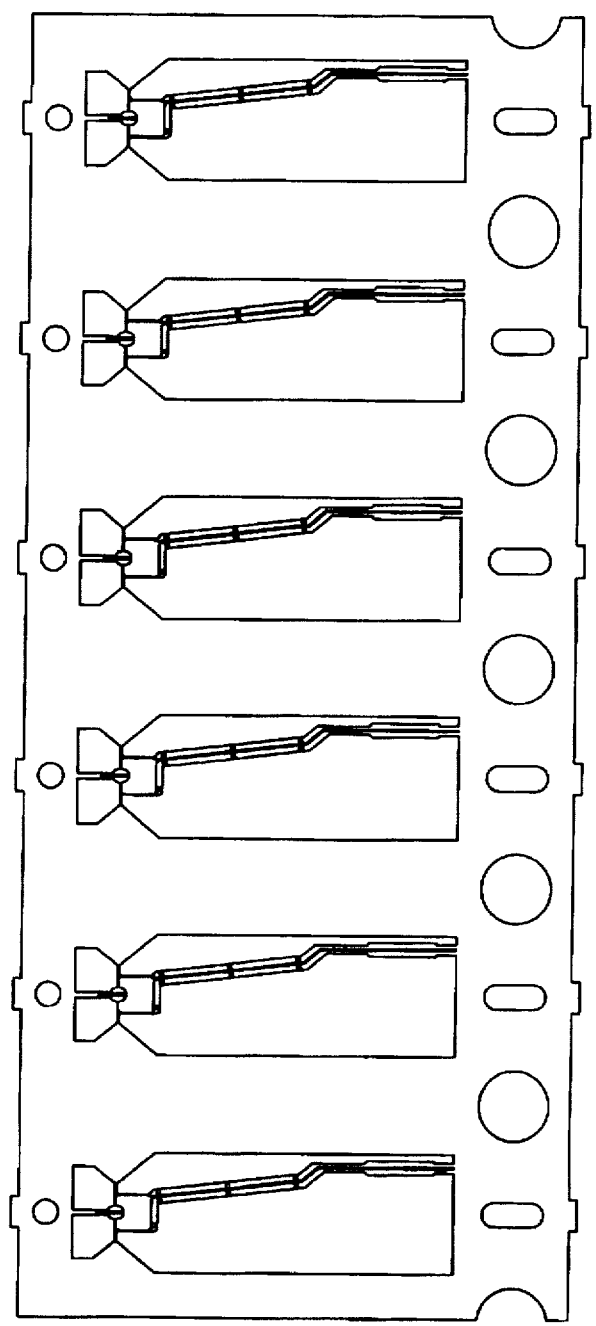
FIG. 11 shows a plan view of a plurality of interconnect assemblies simultaneously manufactured in contiguous regions of a larger sheet of conductive material.

One of the preferred methods of manufacture for the interconnect assembly 11 involves manufacturing the brace 40 simultaneously out of the same sheet of conductive material, preferably a high-yield strength high-tensile srength metal, as the trace interconnects 28. As depicted in FIG. 11, a plurality of interconnect assemblies 11 can be automatably and simultaneously manufactured in contiguous regions of a larger sheet or long strip of the conductive material. The interconnect assemblies 11 can be manufactured alongside each other and separated and supported by shared brace borders 41.

Secured by the support brace 40, the interconnect assembly 11 is so strong that a head assembly 12 may be directly electrically and mechanically coupled to the distal end 24 of the interconnect, prior to attaching the interconnect assembly 11 to the suspension assembly 10. Slider bond pads 46 may be manufactured as part of the distal end 24 to facilitate electrical and mechanical bonding of a head assembly 12 to the interconnect assembly 11. Each slider bond pad 46 includes a wide flat horizontal surface suitable for mechanically attaching and/or electrically coupling the head assembly 12 to the interconnect assembly 11. These electrical couplings may use an electrically conductive epoxy as a bonding agent.

Figure 12:
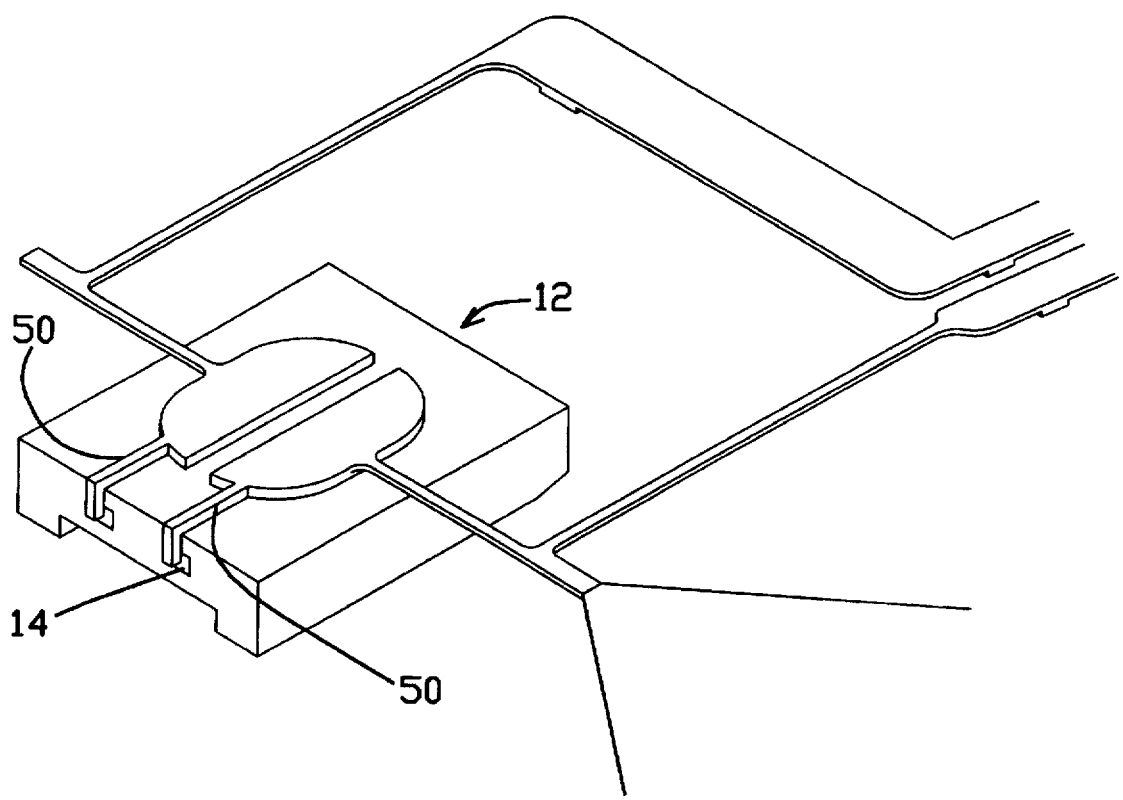
FIG. 12 shows an enlarged detail of the tangs in an interconnect harness connecting to electrical terminals on the head assembly.

Trace tangs 50, further described below, also may be used to facilitate electrically connections, as shown in FIG. 12.

Figure 8:
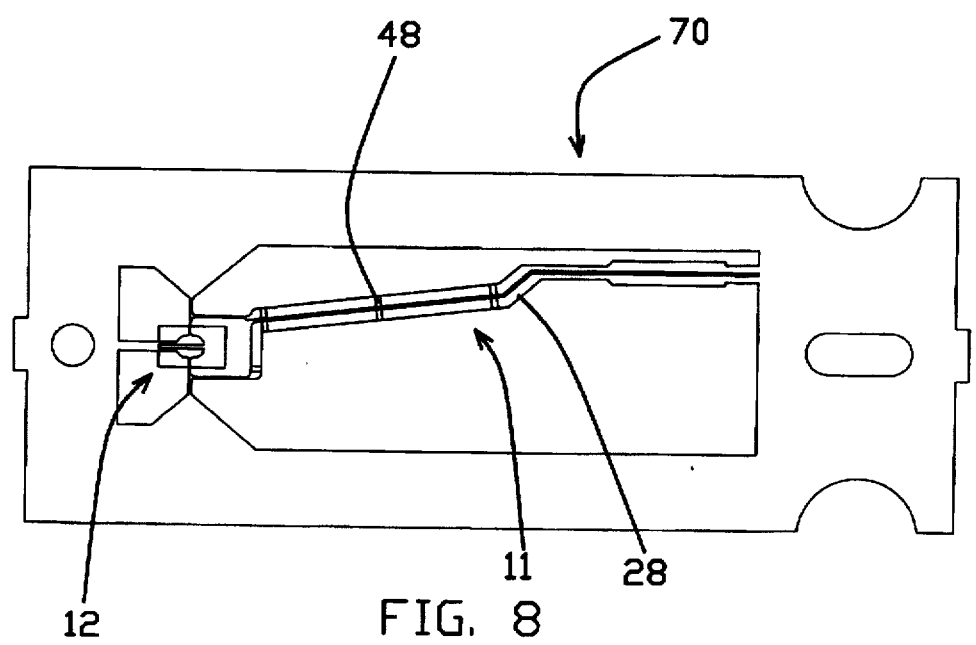
FIG. 8 shows a plan view of a head interconnect harness ready to be mounted on a suspension assembly.
Figure 9:
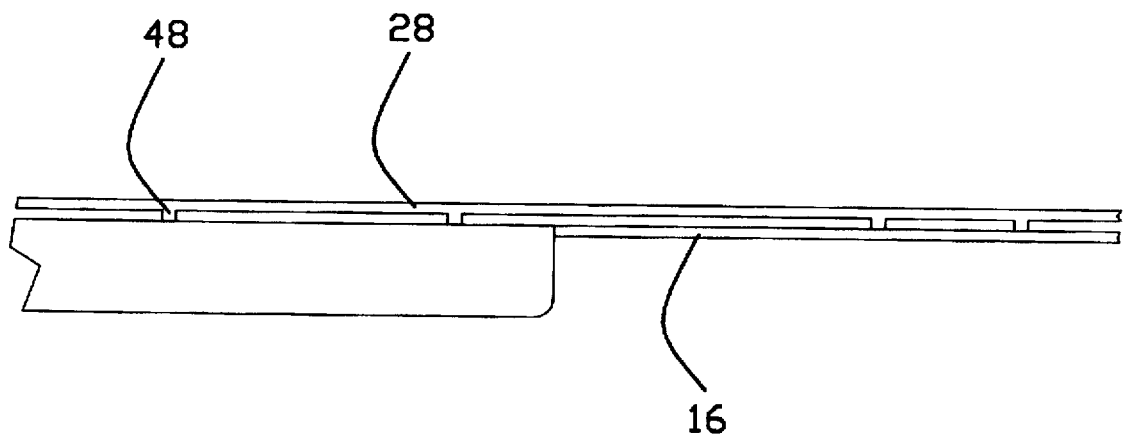
FIG. 9 shows an enlarged side view of the flexible region of a version of the trace interconnect.

Coupling the head assembly 12 to an interconnect assembly 11 creates the sturdy head interconnect harness 70 depicted in FIG. 8 ready for attachment to a variety of suspension assemblies. The harness 70 can be transported or sold independently.

When it is time to mount the trace interconnects 28, a suitable adhesive 36 may be applied atop the first dielectric coating 34 to facilitate lamination of the trace interconnect 28 to the suspension assembly 10. The adhesive 36 can be pressure, heat, or ultraviolet light cured. It may be applied in a format which again coats the entire interconnect assembly 11 or in partial format. The adhesive may be limited to the standoffs 48, to contact points, and/or to other selected regions such as bond pads 46. It may be applied in spray fashion or X-Y coordinate liquid dot fashion. A patterned corrosion protection coating 38 also may be applied to selected areas of the interconnect assembly 11.

An embodiment of the invention further reduces the thickness of the interconnect assembly 11 and increases efficiency by utilizing an adhesive that also acts as a dielectric, such as 3M's EC2290 epoxy. This dielectric/adhesive is spray coated onto the traces to a thickness of about 6.4 micrometers. The dielectric coating 34 can also act as the corrosion coating. As shown by FIG. 4A and 4B, the coatings can be applied in a variety of formats and in different order.

Figure 10:
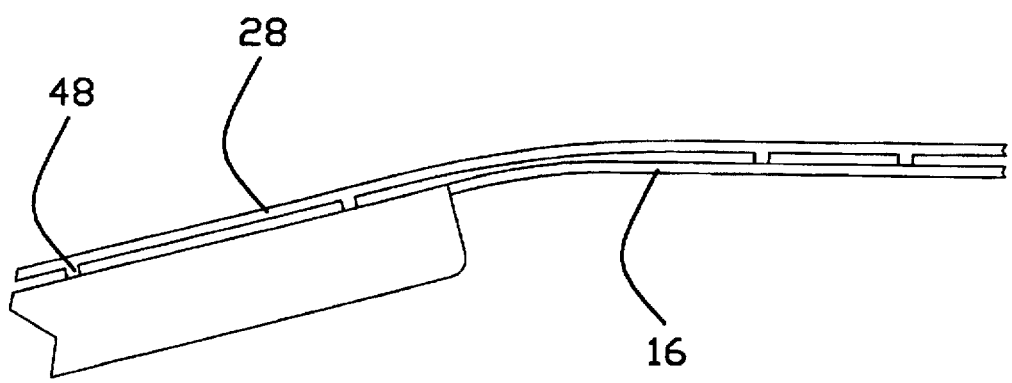
FIG. 10 shows an enlarged side view of the flexible region of another version of the trace interconnect, where e flexible region slopes closer to the flexible region of the suspension assembly.

A preferred way to manufacture integral standoffs 48 is to protect small areas of the first surface 26 while etching the rest of the interconnect assembly 11. Not reducing the trace thickness at the standoff points leaves the integral standoffs 48. The standoffs 48 may be arranged so as to occupy only the rigid region 30, while avoiding the flexible regions 32. Each trace interconnect 28 may further include slopes adjacent to the flexible regions 32, the slopes locating the flexible regions 32 at a plane closer to the suspension assembly 10 along the Z axis. In this format, depicted in FIG. 10, the traces dip down to reduce the Z-axis distance to the load beam 16 as the trace interconnect 28 bridges over flexible regions 18. In this way, thickness and profile, and therefore stiffness, may be increased at the rigid region 30, and reduced at the flexible regions 32.

The trace interconnect 28 also may be shaped as a "S"-curve spring member. In the "S" curve configuration, the trace interconnects 28 cross the flexible regions 18 at an acute angle, thus reducing the stiffening effect vector.

Figure 5:
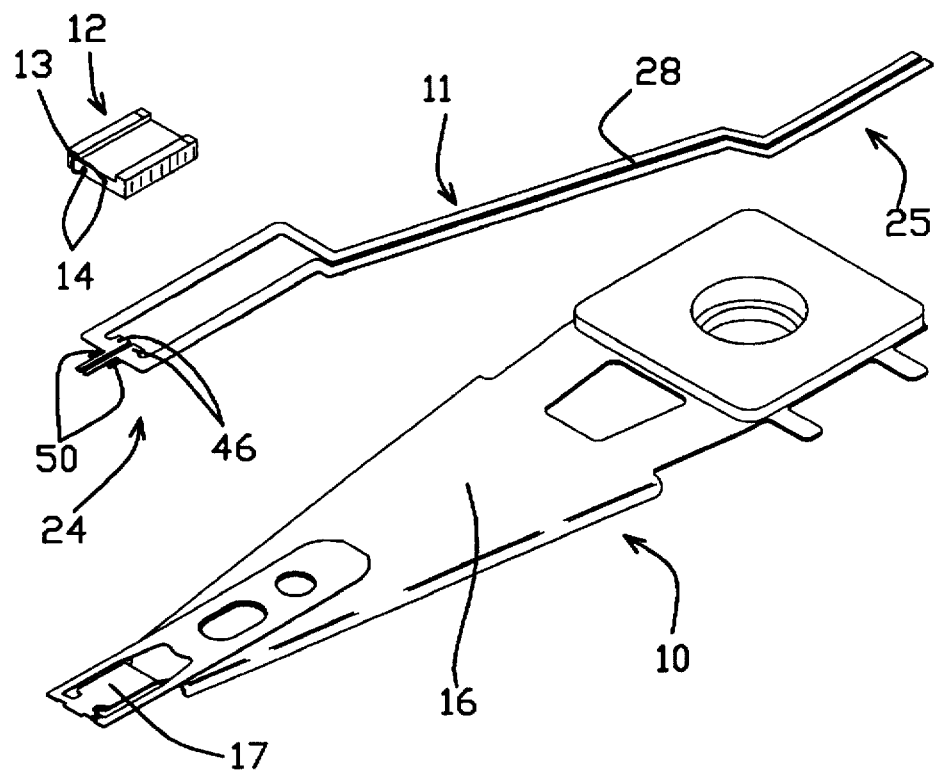
FIG. 5 shows an exploded perspective view of another interconnect assembly embodying features of the present invention, such as trace tangs.

As mentioned above, another additional trace interconnect feature are cantilevered trace tangs 50, such as those shown on FIGS. 5 and 12, protruding from the distal end. The tangs 50 can be straight or can bend in a radial break and extend towards the head assembly 12, generally perpendicularly away from the plane of the trace interconnect 28. The tangs 50 facilitate connection to vertically mounted electrical terminals 14 using known techniques, such as ultrasonic bonding.

Figure 13:
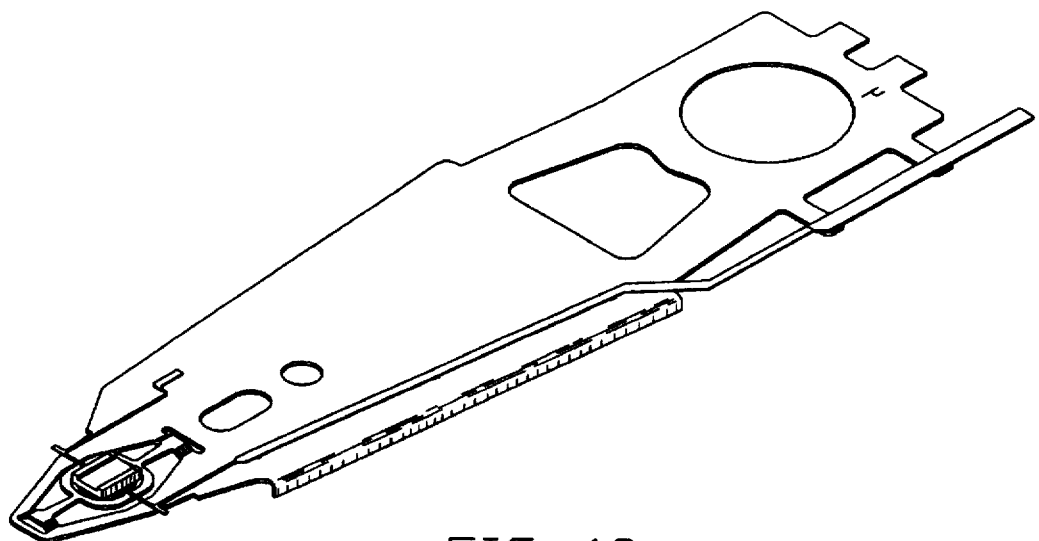
FIG. 13 is a perspective view of a head suspension assembly version which uses the suspension assembly as an additional conductor.

A different version of the present invention, illustrated in FIG. 13, contemplates using one or more trace interconnects and the suspension assembly itself, as an additional conductor, to complete a read/write circuit. This would involve electrically isolating a conductive suspension assembly and coupling it to one of the head's electrical terminals 14. A trace, a projecting tang, a bond pad, or a conventional conductor could be used as the connecting means.

Figure 14:
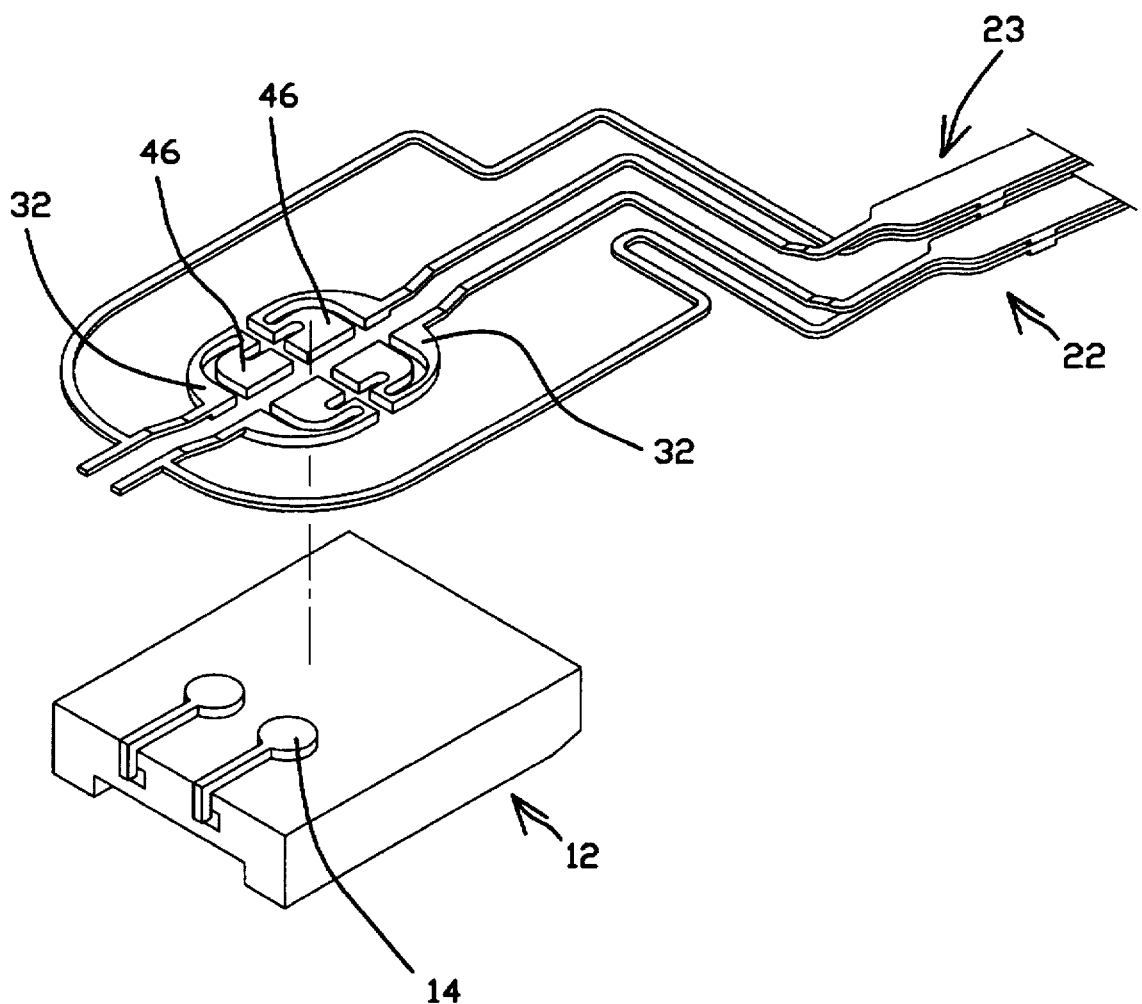
FIG. 14 is an enlarged perspective exploded detail view of the distal end of an electrical interconnect assembly including a grounding trace interconnect.

Most HSAs use the suspension assembly 10 as an electrical ground. But since the trace interconnects 28 and the head assembly 12 are electrically isolated from the suspension assembly 10, an additional trace, shown in detail in FIG. 14, can be used to electrically ground the slider of the head assembly 12 to prevent electro-static buildup. This trace connects to the slider at one end and to the load beam 16, the actuator arm, the chassis or frame, or to other appropriate ground at the other end. An electrically conducting epoxy coats the connections of this trace.

To improve the metallurgical requirements of the electrical bond sites, the base metal could be clad during the milling process or pattern plated with suitable contact metals such as gold, tin, solder, etc. for improved bonding results to electronics flexible cable pads or to the head's electrical terminals 14. The distal end 24 (the head end) and the proximal end 25 (the electronics end) can be patterned or masked clear of insulation or adhesive to allow prepositioned, automatable bonding. A compatible metallurgy could be supplied just at these ends to facilitate the needs of the bonding process.

The preferred material for the trace interconnect 28 must be a good conductor and have high tensile and high yield strengths to prevent damage to the conductors. A preferred material is a beryllium copper alloy (BeCu 172) with a yield strength close to 1.24 gigapascals and a tensile strength close to 1.31 gigapascals. This inventive departure from traditional copper-only conductors, helps make the trace interconnect 28 self-supporting and less prone to damage. Although BeCu has been previously overlooked because it is less conductive than pure copper, BeCu offers great structural advantages over the present materials utilized in typical conductors by approximately matching the 1.14 gigapascal yield strength and 1.31 gigapascal tensile strength of the stainless steel used to define the typical suspension assembly. Low strength, non-spring materials may be easily yielded during adverse handling and assembly operations, imparting unknown stresses into the load beam 16 and gimbal 17, which invariably lead to shifts in the nominal static attitude of the gimbal assembly. A high strength spring material that closely matches the spring characteristics of the suspension assembly (where the tensile strength is typically a minimum of 1.1 gigapascals and the yield strength is typically a minimum of 1.0 gigapascals) under load greatly reduces the chance of subjecting the gimbal assembly to adverse shifts in the static attitude.

But the current invention is not limited to beryllium copper. The use of the support brace 40 allows a trace interconnect assembly 11 made out of softer metals, such as annealed copper, to be manufactured and handled without a substrate.

In the present embodiments of FIGS. 1 and 2, the interconnect assembly 11 has two photochemically etched beryllium-copper alloy traces 12 micrometers thick with standoffs ~50 micrometers thick and a 6.4 micrometer thick dielectrical coating 34. It includes slider bond pads 46 and traces 28 that become narrower in width and thinner in thickness along their flexible regions.

For those head assemblies that require a larger number of signals to be transmitted to and from the head 13, the trace interconnect assembly 11 offers two options. One, it can include more side-by-side trace interconnects 28. Two, a multi-signal stacked array interconnect assembly 60 can be manufactured, specially for load beams that only provide a limited surface on which to place and route the interconnect.

Figure 6:
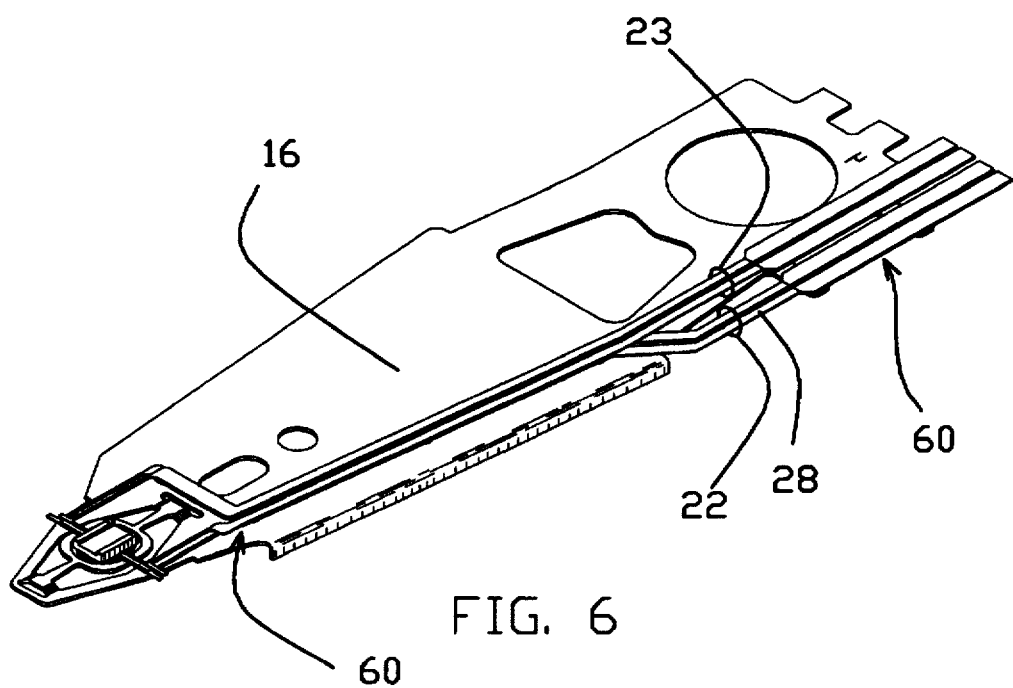
FIG. 6 shows a multi-signal interconnect assembly embodying features of the present invention.
Figure 7:
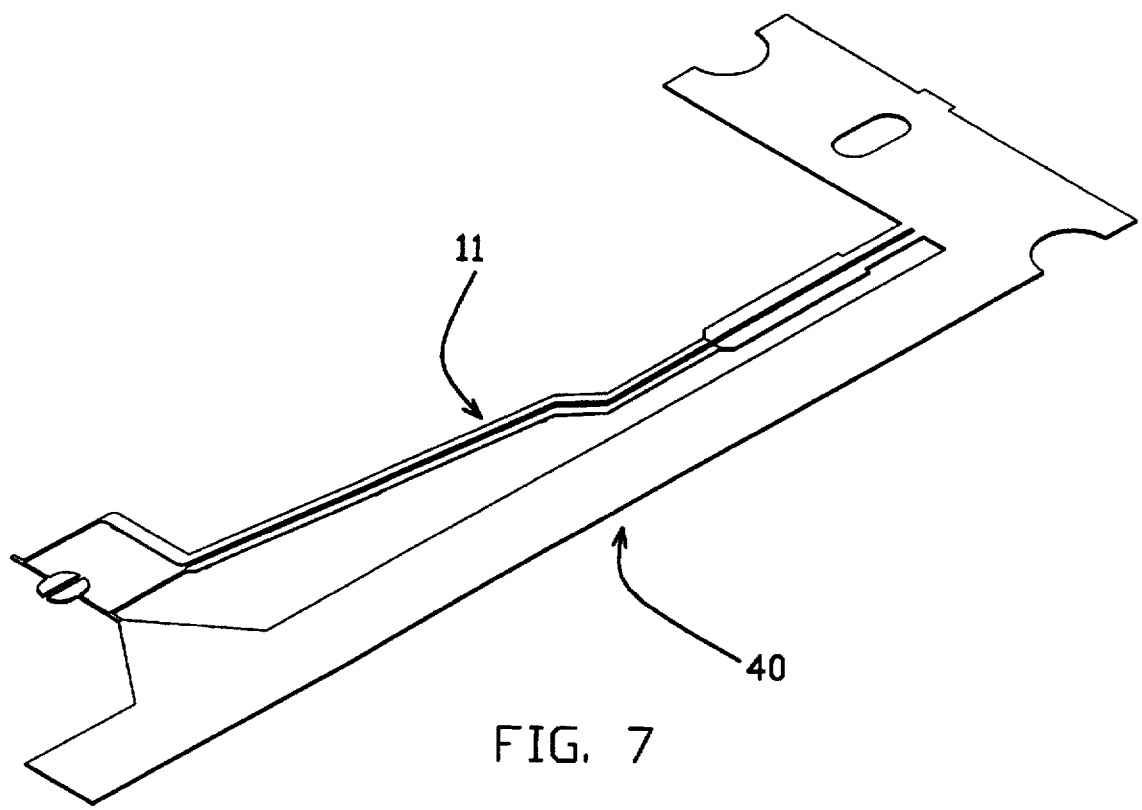
FIG. 7 shows a perspective top view of another embodiment of an interconnect assembly including an L-shaped support brace.

As shown in FIG. 6, this multi-signal interconnect assembly 60 includes sets of trace interconnects stacked and laminated over at least portions of each other to form a multi-level array of sets. There is a first set of traces 22 including one or more of trace interconnects placed coplanarly. A second set of traces 23, including at least one trace interconnect, is stacked over the first set 22. Additional sets of traces can be added, wherein each additional set of traces is stacked and laminated over the preceding set and is shaped and arranged to match at least a portion of the preceding set of traces. The sets of traces, each including at least one trace interconnect, form a stacked array of sets.

The trace interconnects in the additional set 23 are pre-shaped to match both the contours of the suspension assembly 10 and portions of the trace interconnects below them. Standoffs 48 and dielectric coating 34 keep the individual trace interconnects 28 electrically isolated from each other. This reduces the footprint of the path occupied by the multi-signal interconnect assembly 60 on the load beam 16. In order to reduce the stiffness of the multi-signal interconnect assembly 60, the individual trace interconnects 28 may fan out along stiffness sensitive regions, such as the flexible regions 18, in a spaced planar relationship parallel to the suspension assembly 10.

The advantages of the present invention become more apparent during manufacturing of a head suspension assembly. There are two preferred ways to incorporate the present interconnect assembly into the manufacturing process. In the first, the trace interconnects 28 can be attached to a standard suspension design prior to mechanical and/or electrical head bond. The suspension assembly 10 is first fabricated with generally accepted design practices. The interconnect assembly 11 is manufactured separately. The separate interconnect assembly 11 attaches to the surface of the suspension assembly 10, usually to the side facing the disk, although in differently designed HSAs it may attach on the opposite side. In this format, the suspension assembly 10 with the prebonded interconnect assembly 11 is presented for follow-up mechanical and electrical bonding of the head assembly 12. This manufacturing process is more efficient and reduces the complicated fixturing and usable yield loss associated with the use of standard wires or flex circuits.

A second method of manufacture of a HSA involves bonding the head assembly 12 to the interconnect assembly 11 in the braced format prior to the attachment of the interconnect assembly 11 to the suspension assembly 10. This creates the head interconnect harness 70 described above and depicted in FIG. 8. To complete the HSA, the head interconnect harness 70 only needs to be bonded to the surface of the suspension assembly 10. The strength of the interconnect assembly 11 also allows the interconnect harness 70 to be offered to the industry as an independent product for attachment to suspension assemblies.

The head interconnect harness 70 removes the slider bonding step from the manufacturing of suspension assemblies. It resembles the present practice where the twisted wire pair is bonded to the slider prior to bonding the slider to the suspension. Use of the harness 70 avoids the effects of potentially damaging slider fixturing and ultrasonic welding operations which could unpredictably shift the slider static attitude from gimbal spring damage. Decoupling the slider bond sequence from the individual suspensions also offers manufacturing ease by improving the access to the conductive traces and spacing the traces in a repeatable, stepped strip format ideal for automation.

The advantages of the trace interconnect 28 over current systems are numerous. Thanks to the inherent stiffness of its conductive material, the trace interconnect does not depend on a substrate for support. Elimination of the thick, constraining polyimide supporting layer reduces material costs and seed layer and plating processing steps. Absence of a substrate backing results in a trace interconnect 28 that is less stiff, has a lower profile, and has lower mass than comparable flex circuits. Use of integral trace tangs 50 or slider bond pads 46 for electrical connection results in controlled and consistent service loops.

Since most dielectric materials have sufficient dielectric strength to provide satisfactory insulation at thicknesses orders of magnitude smaller than those needed to support flex circuits (2.5 micrometers needed for insulation vs. 25 micrometers minimum needed for support for flex circuitry), the trace interconnect 28 utilizes only a thin spray coating of dielectric/adhesive. Using the adhesive as a dielectric coating further reduces the thickness of the traces. This, in turn, reduces the height profile and shifts the shear axis of the suspension assembly 10 back towards the suspension centerline.

The trace interconnect 28 offers additional stiffness reduction via selective trace width/thickness reduction, "S"-curve spring members, and standoff 48 placement. Trace width alterations additionally result in resistance reduction along its length. Capacitance to ground is also reduced through the integral standoff 48 features and use of an air gap as a dielectric.

The most noticeable feature of the trace interconnect 28 is its structural strength and its ability to resist plastic deformation. The use of high strength materials makes it resistant to variable bias stresses during applied force inputs. The use of a support brace 40 allows pre-formed construction to avoid mechanical displacement and load effects upon the suspension assembly 10. The trace interconnect strength permits free-standing embodiments such as a separate interconnect assembly 11 or the head interconnect harness 70 fabricated independently from the suspension assembly. The combination of this strength and the thin profile and flexibility features allow the stacking of multiple sets of conductors for multi-signal interconnect assemblies to handle complex slider applications.

The trace interconnect 28 greatly aids in processing and manufacturing. A substrateless interconnect fabrication process avoids the need for imprecise dielectric patterning. Compared to polyimide, metal can be more easily formed and shaped to very precise specifications. This results in consistent interconnect routing and mating along the X, Y, and Z axis of the suspension assembly 10 and offers flexibility to address multiple suspension designs. Multiple slider formats also can be addressed through ultrasonic bonded formed tabs or solder attachment. Partial etching can be used to define variable conductor thickness along length and for fine feature patterning.

Beryllium copper has good conductivity, yet has sufficient tensile and yield strength to support itself at the needed thickness and to resist plastic deformation. The use of the attached brace 40 supplies a carrier element, a rigid assembly, and a processing aid that permits the use of materials with lower strengths, such as annealed copper. Since the trace interconnect 28 can be manufactured separately and only added in the later steps of production, even materials with low yield and tensile strengths are less likely to be damaged during the HSA manufacturing processes.

Utilization of a strong, pre-shaped interconnect removes the need for the complex automated machinery needed to place other kinds of conductors. The trace interconnect 28 provides definitive placement and routing through the geometry of the load beam 16 and the gimbal 17. Attachment of the trace interconnect 28 can progress as in tubeless wire interconnects with localized adhesive application, but in a more controlled, repeatable format. Unlike tubeless automated bonding, the trace interconnect 28 does not require tensioning devices to ensure flatness, straightness, or proper placement. The material strength characteristics and the ability to provide for a more substantive trace cross-section in the rigid region 20 of the load beam 16 allow for the inherent stability of the disclosed interconnect without the need for substantial tooling assistance in routing. Predefined connector tangs 50 or pads 46 allow a low-profile geometrically controllable service loop that will not cause fluctuating impedances, loads, or biases, and that will not tangle or snap.

In conclusion, the trace interconnect 28 and trace interconnect assembly 11 offer improved mechanical characteristics, while offering the desired electrical performance. Additionally they simplify and make more efficient the manufacturing of head suspension assemblies.

The invention is not to be taken as limited to all of the details thereof as modifications and variations thereof may be made by workers skilled in the art without departing from the spirit or scope of the invention.

What is claimed is:

1. A method of manufacture for a trace interconnect conductor suitable for mating with a suspension assembly of the type including flexible and rigid regions and for transmitting electrical signals to and from a head assembly, said method of manufacture comprising the steps of:

manufacturing out of a planar sheet of conductive material an elongated, and generally flat trace conductor having rigid and flexible regions that correspond to the rigid and flexible regions in the suspension assembly, a distal end adapted for electrically coupling to an electrical terminal in a head assembly, a proximal end adapted for coupling to processing circuitry, a first major surface, and a second major surface, and pre-shaping the trace conductor such that at least a portion of the trace conductor matches the surface topology of at least a portion of the suspension assembly to which the trace conductor is to be applied.

2. The method of manufacture of claim 1, further comprising the step of applying an adhesive to selected areas of the trace conductors.

3. The method of manufacture of claim 1, wherein said manufacturing step comprises etching the trace conductor from the planar sheet of conductive metal.

4. The method of manufacture of claim 1, further comprising the step of manufacturing a slider bond pad at the distal end of the conductor.

5. The method of manufacture of claim 1, wherein the dielectric coating is spray-coated onto the conductors.

6. The method of manufacture of claim 3, further comprising the step of protecting during etching small regions of the first major surface of the conductors leaving raised integral standoffs.

7. The method of manufacture of claim 3, wherein the planar sheet of conductive metal has a yield strength and a tensile strength similar to that of stainless steel.

8. The method of manufacture of claim 3, wherein the planar sheet of conductive metal comprises a beryllium copper alloy.

9. The method of manufacture of claim 1, wherein the method further comprises coating a selected area of the trace conductor with a dielectric coating.

10. The method of claim 1, further in combination with the step of mating the pre-shaped trace conductor with the suspension assembly to provide a head suspension trace conductor assembly.

11. A method of manufacturing an interconnect assembly for providing electrical interconnect means to a head suspension assembly, comprising the steps of:

manufacturing out of a planar sheet of conductive material at least one pre shaped single-layer thin, elongated, and generally flat substrate-free trace interconnect having a rigid region and flexible regions that correspond to a rigid region and flexible regions in a suspension assembly, a distal end constructed and arranged for electrically coupling to an electrical terminal in a head assembly, a proximal end, a first major surface, and a second major surface, said trace interconnect shaped and arranged along the X, Y, and Z coordinates to match the surface topology of at least a portion of the suspension assembly and extending from the head assembly to a connection terminal;

coating selected areas of the trace interconnect with a thin dielectric coating;

simultaneously manufacturing out of the same sheet of material a support brace for providing a carrier element for alignment and fabrication of the trace interconnects, said support brace bracketing the trace interconnects and including a planar border along at least one side of the interconnect assembly, tooling registration holes, and detachable support tabs attaching the trace interconnects to the planar border.

12. The method of manufacture of claim 11, wherein the support brace and the trace interconnects are etched out of the sheet of conductive material.

13. A method of manufacture for a plurality of interconnect assemblies comprising the steps of:

simultaneously applying the method of manufacture of claim 11 to contiguous regions of a larger planar sheet of resilient conductive substrate-free material, wherein a plurality of interconnect assemblies are manufactured alongside each other and are separated and supported by shared brace borders.

14. A method of manufacture for a head suspension assembly for positioning a head assembly over a rotating data storage device and for transmitting electrical signals to and from the head assembly, said method of manufacture, comprising the steps of:

providing a head assembly having at least one transducer, an air-bearing slider, and electrical terminals;

constructing a suspension assembly including a load beam and a gimbal, the suspension assembly also having a rigid region, flexible regions, a proximal end, a distal end, a first major surface and a second major surface, the gimbal placed at the distal end and constructed and arranged for providing gimballing support to the head assembly;

separately manufacturing out of a planar sheet of conductive material an interconnect assembly having at least one pre-shaped single-layer thin, elongated, and generally flat substrate-free trace interconnect having a rigid region and flexible regions that correspond to the rigid region and the flexible regions in the suspension assembly, a distal end constructed and arranged for electrically coupling to one of the electrical terminals in the head assembly, a proximal end, a first major surface, and a second major surface, said trace interconnect shaped and arranged along the X, Y, and Z coordinates to match the surface topology of at least a portion of the suspension assembly and extending from the head assembly to a connection terminal;

coating selected areas of the interconnect assembly with a thin dielectric and adhesive coating;

attaching the trace interconnects to the first major surface of the suspension assembly, forming an interconnect/ suspension assembly;

attaching the head assembly to the interconnect/ suspension assembly; and electrically coupling the distal end of each trace interconnect to a different electrical terminal on the head assembly.

15. The method of manufacture of claim 14, wherein manufacturing the interconnect assembly comprises the step of etching the trace interconnects out of a sheet of a conductive metal with a yield strength and a tensile strength similar to that of the suspension assembly.

16. The method of manufacture of claim 14, further including the steps of:

manufacturing a support brace for providing a carrier element for the trace interconnects, said support brace bracketing the trace interconnects and including a planar border along at least one side of the interconnect assembly, tooling registration holes, and support tabs attaching the trace interconnects to the planar border;

using the support brace to align the trace interconnects with the suspension assembly during attachment;

detaching the support brace from the trace interconnects by disengaging the support, tabs.

17. The method of manufacture of claim 16, wherein the support brace and the trace interconnects are photochemically etched simultaneously out of a same sheet of a metal with a yield strength and a tensile strength similar to the suspension assembly.

18. The method of manufacture of claim 16, wherein the support brace and the trace interconnects are manufactured out of a beryllium copper alloy.

19. A method of manufacture of a head transducer interconnect harness for mounting an interconnect assembly and a head assembly to a suspension assembly in a rotating data storage device, the suspension assembly having rigid and flexible regions, said method of manufacture comprising the steps of:

providing a head assembly having a slider, a transducer, and electrical terminals for input and output of electrical signals;

manufacturing out of a planar sheet of conductive material an interconnect assembly including at least one pre shaped single-layer thin, elongated, and generally flat substrate-free trace interconnect having a rigid region and flexible regions that correspond to a rigid region and flexible regions in a suspension assembly, a distal end constructed and arranged for electrically coupling to an electrical terminal in the head assembly, a proximal end, a first major surface, and a second major surface, said trace interconnect shaped and arranged along the X, Y, and Z coordinates to match the surface topology of at least a portion of the suspension assembly and extending from the head assembly to a connection terminal, each trace interconnect also including at its distal end a bond pad having a wide contact surface;

coating selected areas of the interconnect assembly with a thin dielectric and adhesive coating;

manufacturing a support brace for providing a carrier element for the trace interconnects, said support brace bracketing the trace interconnects and including a planar border along at least one side of the interconnect assembly, tooling registration holes, and support tabs attaching the trace interconnects to the planar border;

attaching the head assembly to the contact surface of the bond pads; and electrically coupling the distal end of each trace interconnect to a different electrical terminal on the head assembly.

20. The method of manufacture of claim 19 further comprising the step of applying an adhesive to the contact surface of each bond pad for attaching the head assembly.

21. The method of manufacture of claim 19 further comprising the step of applying an electrically conductive epoxy to the contact surface of each bond pad for attaching the head assembly and for electrically coupling the electrical terminals of the head assembly to a corresponding trace interconnect.

22. The method of manufacture of claim 19, wherein the trace interconnects and the support brace are etched out of the sheet of conductive metal with a yield strength and a tensile strength similar to that of stainless steel.

23. The method of manufacture of claim 19, wherein the trace interconnects are made out of a sheet of beryllium copper alloy.

* * * * *

UNITED STATES PATENT AND TRADEMARK OFFICE
CERTIFICATE OF CORRECTION

PATENT NO. : 5,687,479
DATED : November 18, 1997
INVENTOR(S) : Jeffry S. Bennin et al.

It is certified that error appears in the above-indentified patent and that said Letters Patent is hereby corrected as shown below:

Column 15, line 42, delete "conductors" and insert therefor --conductor--

Signed and Sealed this

Third Day of March, 1998

Attest:

BRUCE LEHMAN

Attesting Officer

Commissioner of Patents and Trademarks